United States Patent
Ramachandrarao et al.

(10) Patent No.: US 7,049,053 B2
(45) Date of Patent: May 23, 2006

(54) SUPERCRITICAL CARBON DIOXIDE TO REDUCE LINE EDGE ROUGHNESS

(75) Inventors: Vijayakumar Ramachandrarao, Hillsboro, OR (US); Hyun-Mog Park, Beaverton, OR (US); Subramanyam Iyer, Santa Clara, CA (US); Bob Turkot, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 10/458,850

(22) Filed: Jun. 11, 2003

(65) Prior Publication Data

US 2004/0253550 A1    Dec. 16, 2004

(51) Int. Cl.
*G03F 7/00* (2006.01)

(52) U.S. Cl. ...................... 430/327; 430/322

(58) Field of Classification Search ............ 430/322, 430/327
See application file for complete search history.

(56) References Cited

U.S. PATENT DOCUMENTS

| 6,358,673 B1 * | 3/2002 | Namatsu ..................... 430/311 |
| 2004/0035021 A1 * | 2/2004 | Arena-Foster et al. ........ 34/282 |

* cited by examiner

*Primary Examiner*—Kathleen Duda
(74) *Attorney, Agent, or Firm*—Trop, Pruner & Hu, P.C.

(57) ABSTRACT

Polymer aggregates in a photoresist layer may be dissolved or reduced in dimension by treatment with supercritical carbon dioxide. The supercritical carbon dioxide may be used before and/or after development of the photoresist. The $SCCO_2$ treatment causes swelling of the photoresist and may allow polymer aggregates in the photoresist to be dissolved. Controlled release of the carbon dioxide de-swells the photoresist, resulting in reduced line edge roughness of openings in the photoresist and reduced resistance of metal lines formed in the openings.

16 Claims, 3 Drawing Sheets

SUPERCRITICAL CARBON DIOXIDE TO REDUCE LINE EDGE ROUGHNESS

The present invention relates to the field of semiconductor fabrication, and specifically to patterning using lithography processes.

Patterning a semiconductor device is a multi-step procedure that removes parts of layers on a wafer surface. Patterns may be applied to a wafer using lithography, and openings may be etched. Conductive metal lines and other features may be formed in the openings. Some wafers may require 10 or more separate patterns on various levels.

In lithography, a layer of photoresist may be applied in liquid form, typically by spin coating. The thickness of photoresist may depend on the solids content, viscosity, spin speed, surface tension and drying characteristics of the photoresist. Typically, the thickness is from about 0.5 µm to about 1.5 µm, but may be as low as about 0.2 µm. After photoresist is applied, the wafer may be heated in a soft bake step to at least partially evaporate the solvent in the photoresist.

A mask or reticle may be precisely aligned and stepped across the wafer, and the wafer exposed to a light or energy source. The liquid photoresist to be spun on the wafer includes a solution of light or energy sensitive polymers, along with sensitizers and additives, in a solvent. Exposure to an ultraviolet, deep ultraviolet, or laser light source (or other energy source such as an x-ray or electron beam) changes the polymer's structure and properties. With a negative photoresist, exposure causes the polymers to change from an unpolymerized or soluble state, to a polymerized or insoluble state. With a positive photoresist, exposure converts the polymers from a polymerized or insoluble state, to an unpolymerized or soluble state.

The pattern is developed by chemical dissolution of unpolymerized photoresist. Development leaves in the photoresist layer an exact copy of the pattern on the mask or reticle. After another bake step, generally called hard bake, the top layer left unprotected by photoresist may be removed by plasma etching, and remaining photoresist stripped and removed to leave patterned material underneath such as dielectric or oxide layers. Conductive metal lines and other features may be formed in the now patterned substrate.

Unfortunately, sidewalls of a photoresist layer may exhibit line edge roughness (LER). LER is caused, at least in part, by polymer aggregations in photoresist. Polymers may aggregate to form localized dense solid parts or clumps. Dissolution of aggregates in the exposed (acidic) regions of a positive photoresist may be slow or difficult during the entire development process. As a result, some regions of photoresist may not be successfully removed, but may remain, for example, on the sidewalls. Aggregates remaining at the end of the develop process may revert to solid photoresist on the sidewalls, contributing to LER.

When photoresist having LER is transferred to underlying material which then is etched and filled with copper or polysilicon to form an electrical path, reduced performance or increased defects in semiconductor devices may result, especially as feature sizes continue to decrease. For example, LER of the photoresist may transfer to an underlying dielectric or polysilicon material. As a result, narrow and less smooth metal lines that get patterned and formed in semiconductor devices may have increased resistance especially at higher clock speeds. Further, LER of patterned polysilicon or other material may degrade transistor performance.

An improved photoresist and/or photoresist treatment is needed that will have reduced LER. A method is needed to remove or eliminate polymer aggregates from photoresist. A semiconductor device is needed having critical dimensions within very precise tolerances, metal lines with reduced resistance, and transistors without degraded performance.

DETAILED DESCRIPTION

Figure 1:
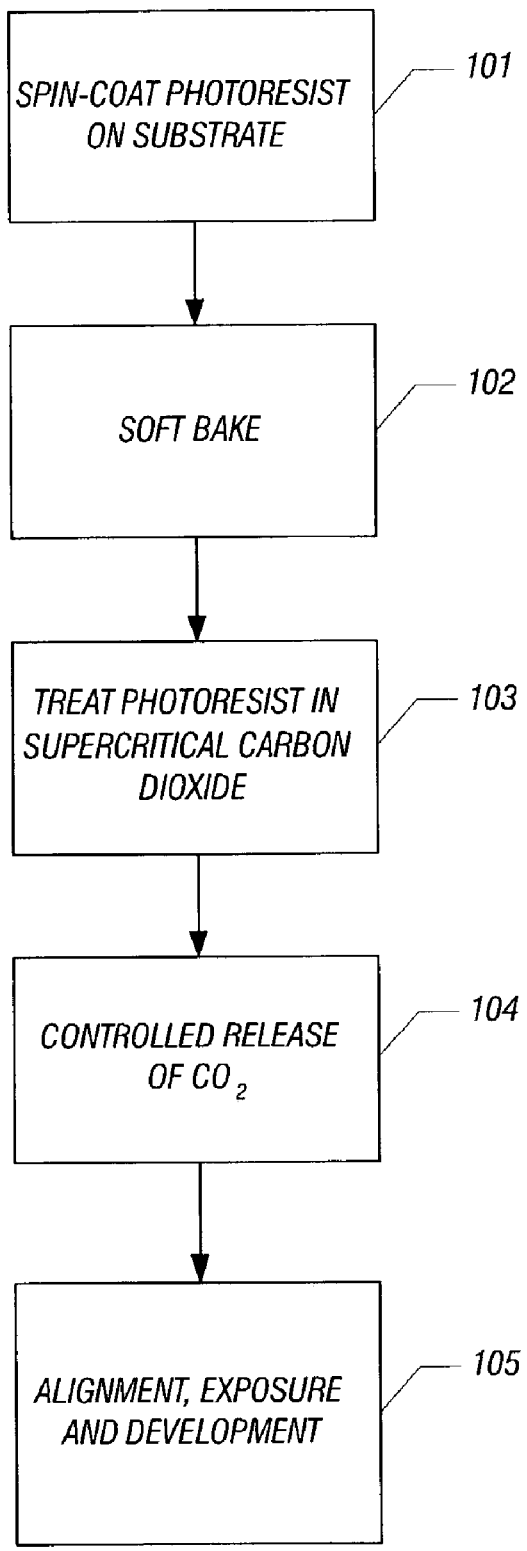
FIG. 1 is a flow diagram of a method of reducing line edge roughness of photoresist in a first embodiment of the invention.

In the embodiment of FIG. 1, photoresist is treated with supercritical carbon dioxide after the photoresist is applied to a substrate, and before the photoresist is developed. As shown in block 101, photoresist, including a polymer component dissolved in a solvent, is applied to a substrate by spin coating. In block 102, the photoresist may be heated during a soft bake step to release and/or evaporate some of the solvent from the photoresist. The soft bake step is not required, however, in every embodiment.

In block 103, the as-spun and/or soft baked photoresist is treated with supercritical carbon dioxide ($SCCO_2$). This also may be referred to as annealing with $SCCO_2$. For example, the $SCCO_2$ treatment may be performed in a sealed chamber in which the semiconductor wafer is positioned. The chamber may be at a pressure and temperature sufficient for $CO_2$ to be in its supercritical phase. For example, preferred temperatures are between about 40 degrees C. and about 90 degrees C., and preferred pressures are between about 1100 psi and about 4000 psi. In one embodiment, treatment of the photoresist with $SCCO_2$ may occur for a time period of about 1 minute to about 60 minutes.

In block 104, there is a controlled release of $CO_2$. The controlled release may be performed by slowly de-pressurizing the chamber. For example, in one embodiment, $CO_2$ is allowed to slowly and controllably escape the chamber through an orifice, until the chamber interior is at ambient pressure. In one embodiment, the time period for controlled release of $CO_2$ may be between about 1 minute and about 30 minutes.

In block 105, a mask or reticle is aligned and the photoresist is exposed to a light or energy source. The photoresist then may be developed using a solvent in liquid phase or a solvent suspend or dissolved in $CO_2$. Resulting sidewalls of the photoresist have minimal and/or reduced line edge roughness (LER).

Figure 2:
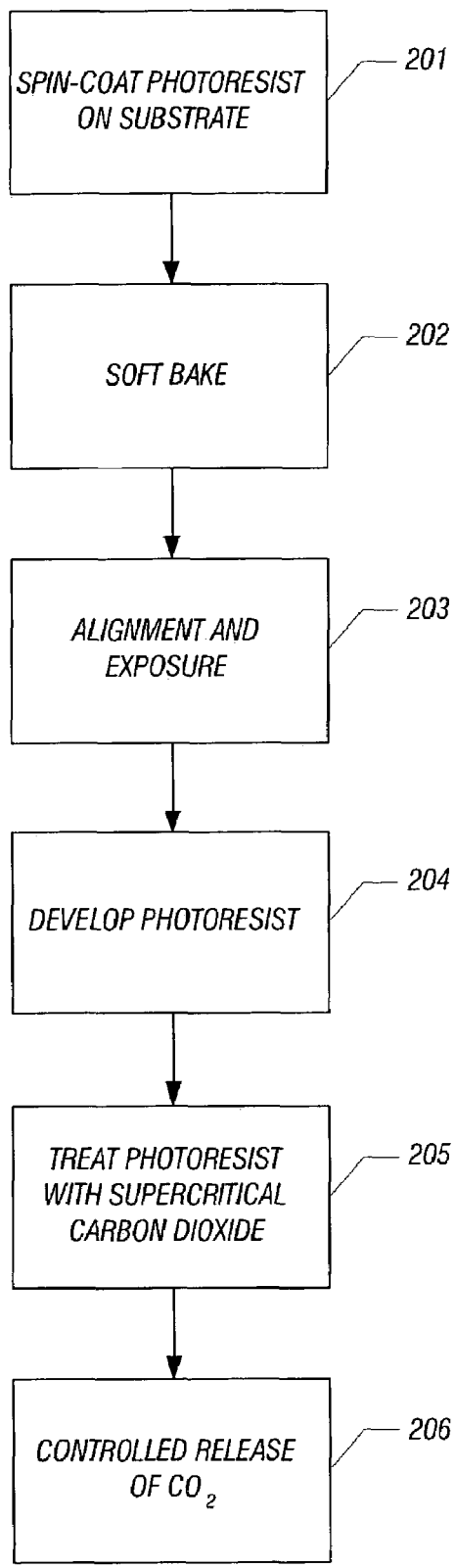
FIG. 2 is a flow diagram of a method of reducing line edge roughness of photoresist in a second embodiment of the invention.

In the embodiment of FIG. 2, the photoresist is treated with $SCCO_2$ after the photoresist is exposed to light for patterning and subsequent development using liquid phase techniques. In block 201, photoresist may be applied, for example by spin coating on a substrate. In block 202, the photoresist may be heated in a soft bake step. In block 203, a mask or reticle is aligned and the photoresist exposed to a light or energy source. In block 204, the photoresist may be developed using a developing solvent.

In block 205, the substrate is exposed to $SCCO_2$ resulting in the sorption of $SCCO_2$ in the developed photoresist. For example, the embodiment of FIG. 2 may use the same or similar $SCCO_2$ treatment described in the embodiment of FIG. 1. In block 206, there is a controlled release of the $SCCO_2$ from the photoresist by de-pressurizing the chamber, resulting in smooth sidewalls and reduced LER.

Optionally, low concentrations of bases may be dissolved in the $SCCO_2$, to dissolve acidic sites remaining on the photoresist sidewall after the develop process. $SCCO_2$, due to its relatively high diffusivity and swelling capability (comparable to organic solvents), may dissolve these acidic sites, removing a source of roughness. The basicity and polarity of $SCCO_2$ may be optimized for the specific lithography process by the addition of co-solvent(s).

Treatment of photoresist with $SCCO_2$ may dissolve and/or redistribute polymer aggregates in the photoresist, including those aggregates formed before or after development of the photoresist. The $SCCO_2$ treatment may lower the viscosity of the photoresist, add free volume to the photoresist, and/or help disentangle polymer chains in the photoresist. $SCCO_2$ treatment may increase the diffusion coefficients of polymer chains in the polymer matrix. By reducing or eliminating polymer aggregates in the photoresist, LER may be reduced. As a result, photoresist sidewalls have smoother surfaces, as do metal lines and other device features subsequently formed on the substrate by plasma etching and metal deposition techniques.

Treatment with $SCCO_2$ also may lower the glass transition temperature of the photoresist. The glass transition temperature is the temperature at which the polymer components in photoresist undergo transition between a glass and a rubber. The transition may lead to a relaxation of the polymer chains.

The $SCCO_2$ treatment may cause or contribute to swelling of the photoresist and, more specifically, to swelling of polymer components in the photoresist. The degree of swelling may depend at least in part on the temperature, pressure and duration of treatment with $SCCO_2$. For example, in one embodiment, the swelling may be between about 10% and about 25% by volume. The amount of swelling also may be controlled by the amount of $SCCO_2$ dissolved in the photoresist. During $SCCO_2$ treatment, sidewall surfaces of the photoresist layer may show some curvature because of surface forces related to the viscosity of the photoresist.

Controlled slow release of $CO_2$ from the photoresist after a sufficient time in the swollen state may result in de-swelling. The controlled slow release of $CO_2$ allows the photoresist to relax to provide a more uniform sidewall and reduced LER.

In accordance with the present invention, many different photoresists may be used including but not limited to poly-methyl methacrylate (PMMA)-based and fluoropolymer-based photoresists. Block copolymers such as maleic anhydride and olefin-based blocks also may be used.

$SCCO_2$ is carbon dioxide that is compressed and heated so that it exhibits properties that are akin to that of a liquid and a gas at the same time. At or above the critical temperature and pressure, carbon dioxide is in the supercritical phase. Depending on the photoresist used, $SCCO_2$ may be absorbed in polymer components in a range from about 10% to about 40% by weight.

In general, $SCCO_2$ has relatively high diffusivity and comparable swelling capability to organic solvents. In one embodiment, the basicity and polarity of $SCCO_2$ may be optimized for lithography processes by the addition of co-solvents. Co-solvents may be used to enhance the swelling and/or dissolution of acidic sites of the post-developed photoresist in the embodiment of FIG. 2. For example, other co-solvents and/or supercritical solvents including but not limited to ethane, acetone, isopropyl alcohol, organic based solvents that are soluble in $SCCO_2$, mixtures of organic solvents and bases such as tetra methyl ammonium hydroxide, or fluorocarbon-based solvents, may be provided to the chamber in which the photoresist layer is treated with $SCCO_2$. A surfactant also may be used to further enhance the $SCCO_2$ treatment on LER.

Figure 3C:
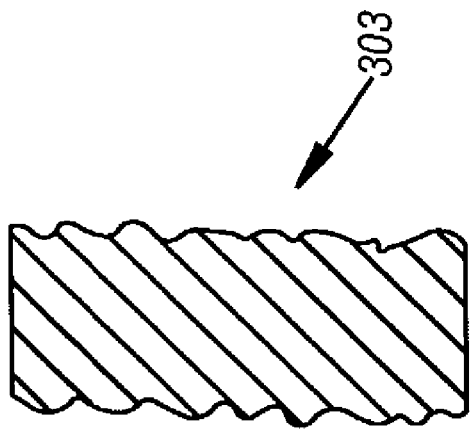
FIG. 3C is a cross section representation of a photoresist after controlled release of supercritical carbon dioxide.
Figure 3B:
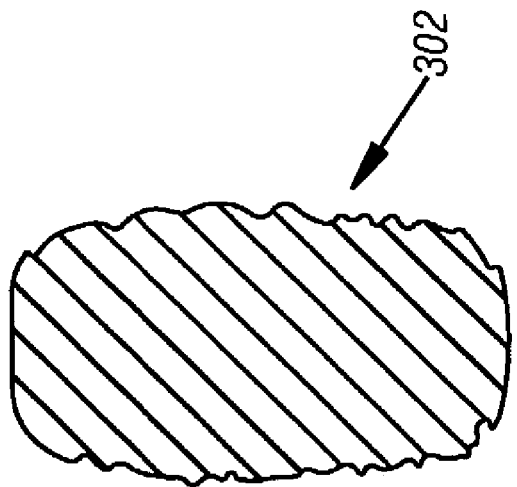
FIG. 3B is a cross section representation of a photoresist swollen with supercritical carbon dioxide.
Figure 3A:
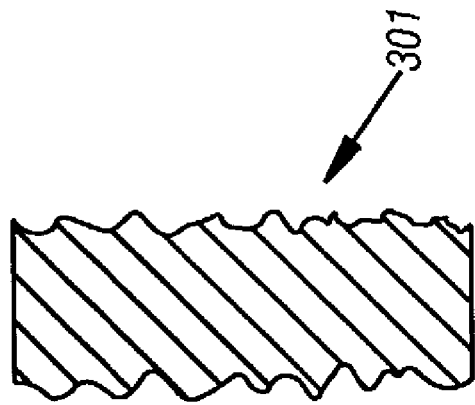
FIG. 3A is a cross section representation of a photoresist without supercritical carbon dioxide treatment.

Now referring to FIG. 3A, photoresist section 301 before $SCCO_2$ treatment is shown having LER. This represents a cross section of a photoresist layer that may be encountered after block 204 in FIG. 2. In FIG. 3B, photoresist section 302 is shown in the swollen state due to treatment with $SCCO_2$. In FIG. 3C, photoresist section 303 is shown after controlled release of the $SCCO_2$, resulting in smoother sidewalls with reduced LER.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a layer of undeveloped photoresist on a substrate;
   treating the undeveloped photoresist with supercritical carbon dioxide to swell the undeveloped photoresist; and
   controllably releasing the carbon dioxide from the photoresist.

2. The method of claim 1 further comprising treating the photoresist with a co-solvent.

3. The method of claim 1 further comprising annealing the photoresist in the supercritical carbon dioxide.

4. The method of claim 1 further comprising spin coating the photoresist on the substrate.

5. The method of claim 1 further comprising forming openings in the photoresist layer, the openings having reduced line edge roughness.

6. The method of claim 5 further comprising forming metal lines in the openings.

7. The method of claim 1 wherein controllably releasing the carbon dioxide from the photoresist reduces the swelling.

8. A method comprising:
   forming a layer of undeveloped photoresist on a semiconductor substrate;
   positioning the substrate having the undeveloped photoresist layer in a chamber into which carbon dioxide is introduced at a pressure and a temperature sufficient for the carbon dioxide to be in a supercritical phase; and
   controllably releasing the pressure from the chamber.

9. The method of claim 8 further comprising developing the photoresist on the substrate.

10. The method of claim 8 further comprising swelling the photoresist layer.

11. The method of claim 10 wherein controllably releasing the pressure from the chamber de-swells the photoresist layer.

12. The method of claim 8 further comprising reducing the viscosity of the photoresist.

13. The method of claim 8 further comprising forming openings in the photoresist layer.

14. The method of claim 8 further comprising treating the photoresist layer with a co-solvent.

15. The method of claim 8 further comprising dissolving a base in the supercritical carbon dioxide.

16. The method of claim 15 wherein the base dissolves acidic aggregate sites on a sidewall of the photoresist layer.

* * * * *